（12） United States Patent
Vanhaelemeersch et al.

(10) Patent No.: US 6,821,884 B2
(45) Date of Patent: Nov. 23, 2004

(54) METHOD OF FABRICATING A SEMICONDUCTOR DEVICE

(75) Inventors: Serge Vanhaelemeersch, Leuven (BE); Karen Maex, Herent (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 97 days.

(21) Appl. No.: 10/078,284

(22) Filed: Feb. 15, 2002

(65) Prior Publication Data

US 2002/0173142 A1 Nov. 21, 2002

Related U.S. Application Data

(60) Provisional application No. 60/269,109, filed on Feb. 15, 2001.

(51) Int. Cl.[7] ............................................. H01L 21/4763
(52) U.S. Cl. ...................... 438/637; 438/639; 438/643; 438/653; 438/700
(58) Field of Search ................................. 438/637, 639, 438/643, 653, 700

(56) References Cited

U.S. PATENT DOCUMENTS

| 5,176,790 | A |   | 1/1993  | Arleo et al. |         |
|-----------|---|---|---------|--------------|---------|
| 5,674,787 | A | * | 10/1997 | Zhao et al.  | 438/627 |
| 5,818,071 | A |   | 10/1998 | Loboda et al.|         |
| 5,904,565 | A |   | 5/1999  | Nguyen et al.|         |
| 6,037,257 | A | * | 3/2000  | Chiang et al.| 438/687 |
| 6,300,236 | B1| * | 10/2001 | Harper et al.| 438/618 |
| 6,329,290 | B1| * | 12/2001 | Zhao         | 438/700 |
| 6,410,437 | B1| * | 6/2002  | Flanner et al.| 438/689|
| 6,518,174 | B2| * | 2/2003  | Annapragada et al. | 438/637 |
| 2002/0106895 | A1| * | 8/2002 | Chung    | 438/687 |
| 2002/0119664 | A1| * | 8/2002 | Annapragada et al. | 438/700 |

* cited by examiner

Primary Examiner—George Fourson
Assistant Examiner—Michelle Estrada
(74) Attorney, Agent, or Firm—Knobbe Martens Olson & Bear LLP

(57) ABSTRACT

This invention relates to Integrated Circuit (IC) processing and fabrication. A device and a method are provided for etching an opening in an insulating layer while depositing a barrier layer on the side walls of the opening without essentially depositing a barrier layer on the bottom of the opening.

15 Claims, 1 Drawing Sheet

METHOD OF FABRICATING A SEMICONDUCTOR DEVICE

RELATED APPLICATION

This application claims the benefit of U.S. Provisional Application No. 60/269,109 filed Feb. 15, 2001.

FIELD OF THE INVENTION

This invention relates to Integrated Circuit (IC) processing and fabrication. A device and a method are provided for etching an opening in an insulating layer while depositing a barrier layer on the side walls of the opening without essentially depositing a barrier layer on the bottom of the opening.

BACKGROUND OF THE INVENTION

Over the years, the demand for higher speed integrated circuits has been addressed through shrinkage of the device dimensions and increase of the packing density of the devices in integrated circuits or on carrier packages. By decreasing the layout rules of the devices, one can obtain transistors with higher intrinsic switching speed. In addition, putting the devices closer to each other reduces the communication time between transistor devices. Both approaches allow building circuits with increased overall performance, i.e., higher switching speed combined with higher functional circuits. Additionally, the integrated circuit area has increased, leading to circuits with even higher functionality as more devices can be integrated in a given area.

The structures connecting these devices can comprise multiple metal levels which are, depending upon the aimed interconnect pattern, either separated one from another by means of interlevel electrically insulating layers or connected one to the other by means of a conductive connection through these insulating layers. These insulating layers also take part in the separation of interconnect structures defined on the same metal level. Besides the downscaling of the dimensions of these interconnecting structures, additional measures are required to be able to meet the stringent speed specifications.

For future technologies the increasing impact of the back end processing in the fabrication of integrated circuits is recognized. A major change in back end processing is necessitated by the ever-decreasing feature size of the devices of integrated circuits that has indicated RC delay-time of the interconnect structures to be the limiting speed factor of the next generation of integrated circuits. To address this problem, two major routes are being explored: introduction of metals with higher conductivity and introduction of dielectric materials with lower dielectric constants.

The introduction of these materials has changed the outlook of the back end processing schemes where dry etch processes, cleaning recipes, and barrier requirements all need to be adapted.

Although aluminum alloys and oxides are still widely used in interconnect technology, copper and new low-k dielectrics, e.g., polymers, are rapidly being implemented in microelectronics as they are now accepted as the future materials of choice. Copper offers a lower resistance and, depending on many processing parameters, this low resistivity can be combined with a better resistance to electromigration. The introduction of copper requires the introduction of damascene processing, which is an important change with respect to classical processing that uses patterning of the conductive elements. In damascene processing, trenches are formed in the insulating layers. After the patterning of the trenches, metal layers are deposited in the trenches and on top of the insulation layers. Finally, the metal layer is polished down to the top of the insulating layers, leaving only the via and trenches filled with metal.

The use of copper in interconnect structures has some commonly known disadvantages. Copper can diffuse very fast in the surrounding insulating layers, such as the low-k materials, which negatively affects the reliability and the signal delay. Several solutions have been proposed to solve this problem. The currently used techniques inhibit the migration of copper ions in the surrounding layers by depositing, in a non-selective way, diffusion barrier layers, e.g., refractory metals such as tantalum nitride (TaN), titanium nitride (TiN) in between the copper and the insulating layers. The horizontal, i.e. the bottom, as well as the vertical side walls of an opening in these insulating layers, e.g. a via or contact hole, are therefore covered with a barrier material. In case of Chemical Vapor Deposition (CVD) techniques, the barrier is conformal deposited. In case of Physical Vapor Deposition (PVD) techniques, the coverage of the vertical side walls of an opening and the bottom of this opening is less, compared to the coverage of the top of the opening. However, the ratio between side wall and horizontal coverage can be tuned to a certain extent by modifying the process parameters, such as deposition power and the bias of deposition.

Several problems are related to the above-mentioned process. Since a barrier layer is always deposited on both the vertical side walls and the bottom surface of an opening in the insulating layer, the presence of a barrier layer on the bottom of the opening causes several inconveniences. In order to ensure the conductivity of the metal lines, the barrier on the bottom of the opening must be made of an electrically conductive material. The adhesion between the barrier layer and the underlying conductive layer is not always good, thereby influencing the current flow between the different conductive levels. When the opening is afterwards filled with a metal in order to connect the metal layer underneath the insulating layer, the barrier layer between both metal layers has a detrimental effect on the electromigration behavior of the structure.

In addition, the exposure of the copper layers to the dielectric etch plasma in the classical scheme leads to the formation of residues on top of the copper. At the same time, copper sputtering, even though in very small amounts, and re-deposition onto the unprotected low-k side walls can not be avoided. Therefore, one has to make use of after-etch cleaning methods to remove the copper from the side walls of the opening etched in the insulating low-k material in order to prevent copper diffusion into the low-k material. After etching of the barrier, further cleaning methods are needed to clean up the residues on top of the copper in order to obtain a good via resistance. The different cleaning methods that are used must be compatible with the presence of the low-k material and must avoid sputtering of copper onto the side walls of the opening.

In the damascene metallization scheme, the first step is a pre-clean of the copper surface, which can be an in-situ pre-clean. This step includes the high risk of having re-deposition of copper on the low-k side wall, which may lead to its subsequent diffusion into the low-k material during the following barrier sputter process at higher temperature. In addition, it is clear that the pre-clean process step may also change the low k material properties leading to, e.g., an increased k value after the full process integration. The formation of TaN barrier layers with PVD techniques is difficult for high aspect ratio features, due to the intrinsic limited step coverage of such a process. Bad quality TaN barriers or layers which are too thin may lead to local breakdown of the copper barrier film and thus create a diffusion path for the copper.

The CMP process step makes use of two different slurries for, respectively, the CMP removal of copper and of the TaN. This makes the CMP process very difficult, very complex and very time-consuming and slurry-consuming, resulting in a high cost of ownership with medium process quality only.

When an opening is formed in a porous insulating material, the pores of the insulating material at the side wall of the opening are intersected, resulting in a rough side wall. Subsequently, the barrier layer is deposited by, e.g., PVD on the side walls of the opening, resulting in a barrier layer with the same profile as the rough side wall of the opening. This has a detrimental effect on the final device performance.

U.S. Pat. No. 5,818,071 discloses interconnect structures incorporating a silicon carbide layer as a diffusion barrier layer, more specifically a layer between a dielectric and a highly conductive metal layer with a resistivity less than about 2.5 microhm-centimeters. U.S. Pat. No. 5,818,071 does not disclose how to pattern or to remove the silicon carbide layer selectively to expose the underlying layer, more particularly a metal layer.

U.S. Pat. No. 5,904,565 discloses a method for selectively forming barrier layers in a via or damascene structure after patterning these vias and damascene structures.

U.S. Pat. No. 5,176,790 discloses an improved process for forming a via in an integrated circuit by etching through an insulating layer while inhibiting the sputtering of the underlying metal. The process is performed by, e.g., using in the gaseous etchant one or more 3–6 carbon atom fluorinated hydrocarbons having the chemical formula $C_xH_yF_z$.

SUMMARY OF THE INVENTION

A method for etching an opening in an insulating layer while depositing a barrier layer on the side walls of the opening without essentially depositing a barrier layer on the bottom of the opening is therefore desirable.

In a first embodiment, a method is disclosed for forming at least one opening in an insulating layer on a substrate while depositing a barrier layer on the side walls of the opening without essentially depositing the barrier layer on the bottom of the opening, comprising the steps of: subjecting the substrate to a plasma, the plasma being generated in a gaseous mixture comprising at least three components: a first component for depositing the metal barrier layer on at least the side walls of the opening, a second component for forming an opening in the insulating layer, and a third component for removing the barrier layer being formed on the bottom of the opening; etching the insulating layer with the plasma; and depositing the barrier layer on the side walls of the opening with the plasma.

The steps of etching and depositing are performed by controlling the plasma in a manner that while creating an opening in an insulating layer, a barrier layer is formed on the side walls of the opening without essentially forming a barrier layer on the bottom on the opening.

In an aspect of the first embodiment, the first component comprises at least one of the group consisting of 1-methyl silane, 2-methyl silane, 3-methyl silane, 4-methyl silane, a mixture of $SiH_4$ and $N_2$, a mixture of $WF_6$ and $N_2$, and combinations thereof.

In a further aspect of the first embodiment, the second component comprises at least one of the group consisting of $N_xO_y$, $C_xF_yH_zO_u$, $N_2/O_2$, $N_2/H_2$, $O_2$, $O_3$, $NH_3$, $CO$, $CO_2$, $CH_4$, and combinations thereof.

In a further aspect of the first embodiment, the third component comprises at least a chemical compound that form halogen ions or radicals in the etching plasma.

In a further aspect of the first embodiment, the third component is at least one of the group consisting of $NF_3$, $SF_6$, $F_2$, $ClF_3$, and $C_xF_yH_z$.

In a further aspect of the first embodiment, the gaseous mixture further comprises an inert gas.

In a further aspect of the first embodiment, the plasma is a continuous plasma. In a further aspect of the first embodiment, a method as recited in the first aspect of a preferred embodiment is disclosed wherein the plasma is a pulsed plasma.

In a further aspect of the first embodiment, the barrier layer is a metal diffusion barrier layer. Preferably, the barrier layer is a copper diffusion barrier layer. The barrier layer can be selected from the group consisting of Ti, TiN, Ta, TaN, $Ta_xSi_yN_z$, $W_xN_y$, $W_xC_yN_z$, SiC, SiOC, hydrogenated SiC, hydrogenated SiOC, and combinations thereof.

In a further aspect of the first embodiment, the insulating layer comprises at least a porous material. The insulating layer can be an organic containing insulating layer or an inorganic containing insulating layer.

In a further aspect of the first embodiment, the opening is a via hole, the via hole extending through the insulating layer to an underlying conductive layer or an underlying barrier layer.

In a further aspect of the first embodiment, the method further comprises, prior to the step of subjecting the substrate, the steps of covering the insulating layer with a bilayer, the bilayer comprising a resist hard mask layer being formed on the insulating layer and a resist layer being formed on the hard mask layer; and patterning the bilayer.

In a second embodiment, a device is provided, the device comprising an insulating layer on a substrate, the insulating layer having an opening, wherein side walls of the opening are covered with a barrier layer and a bottom of the opening is essentially not covered with the barrier layer, characterized in that the device is produced by a method comprising the steps of: subjecting the substrate to a plasma, wherein the plasma is generated in a gaseous mixture comprising at least three components, the components comprising: a first component for depositing the metal barrier layer on at least the side walls of the opening, a second component for forming an opening in the insulating layer, and a third component for removing the barrier layer formed on the bottom of the opening; etching the insulating layer with the plasma; and depositing the barrier layer on the side walls of the opening with the plasma.

In a first aspect of the second embodiment, the first component is selected from the group consisting of 1-methyl silane, 2-methyl silane, 3-methyl silane, 4-methyl-silane, a mixture of $SiH_4$ and $N_2$, and combinations thereof.

In a further aspect of the second embodiment, the second component is selected from the group consisting of $N_xO_y$, $C_xF_yH_xO_u$, $N_2/O_2$ mixtures, $N_2/H_2$ mixtures, $O_2$, $O_3$, and combinations thereof.

In a further aspect of the second embodiment, the third component comprises a chemical compound that forms a halogen ion or a radical in the plasma.

In a further aspect of the second embodiment, the third component is selected from the group consisting of $NF_3$, $SF_6$, $F_2$, $ClF_3$, and mixtures thereof.

In a further aspect of the second embodiment, the gaseous mixture further comprises an inert gas.

In a further aspect of the second embodiment, the plasma is a continuous plasma. In a further aspect of the second embodiment, the plasma etching is a pulsed plasma.

In a further aspect of the second embodiment, the barrier layer is a metal diffusion barrier layer. The barrier layer may comprise silicon carbide.

In a further aspect of the second embodiment, the insulating layer may comprise a porous material. Alternatively, the insulating may organic containing insulating layer or an inorganic containing insulating layer.

In a further aspect of the second embodiment, the opening is a via hole, the via hole extending through the insulating layer to an underlying conductive layer or an underlying barrier layer.

In a further aspect of the second embodiment, the method for producing the device further comprising the steps of: covering the insulating layer with a bilayer, the bilayer comprising a resist hard mask layer formed on the insulating layer and a resist layer formed on the hard mask layer; and patterning the bilayer.

In a third embodiment, a gaseous mixture is provided for use in a method for forming at least one opening in an insulating layer on a substrate while depositing a barrier layer on side walls of the opening without essentially depositing the barrier layer on a bottom of the opening, wherein a plasma is generated from the gaseous mixture, and wherein the gaseous mixture comprises a first component, a second component, and a third component, wherein the first component deposits a barrier layer on the side wall of the opening, wherein the second component forms the opening in the insulating layer, and wherein the third component removes the barrier layer formed on the bottom of the opening.

In a first aspect of the third embodiment, the first component is selected from the group consisting of 1-methyl silane, 2-methyl silane, 3-methyl silane, 4-methyl-silane, a mixture of $SiH_4$ and $N_2$, a mixture of $WF_6$ and $N_2$, and mixtures thereof.

In a further aspect of the third embodiment, the second component is selected from the group consisting of $N_xO_y$, $C_xF_yH_xO_u$, $N_2/O_2$ mixtures, $N_2/H_2$ mixtures, $O_2$, $O_3$, $NH_3$, $CO$, $CO_2$, $CH_4$, and mixtures thereof.

In a further aspect of the third embodiment, the third component comprises a chemical compound that forms a halogen ion or a radical in the plasma. The third component may be selected from the group consisting of $NF_3$, $SF_6$, $F_2$, $ClF_3$, and mixtures thereof.

In a further aspect of the third embodiment, the gaseous mixture further comprises an inert gas.

DETAILED DESCRIPTION OF THE PREFERRED EMBODIMENTS

Figure 1:
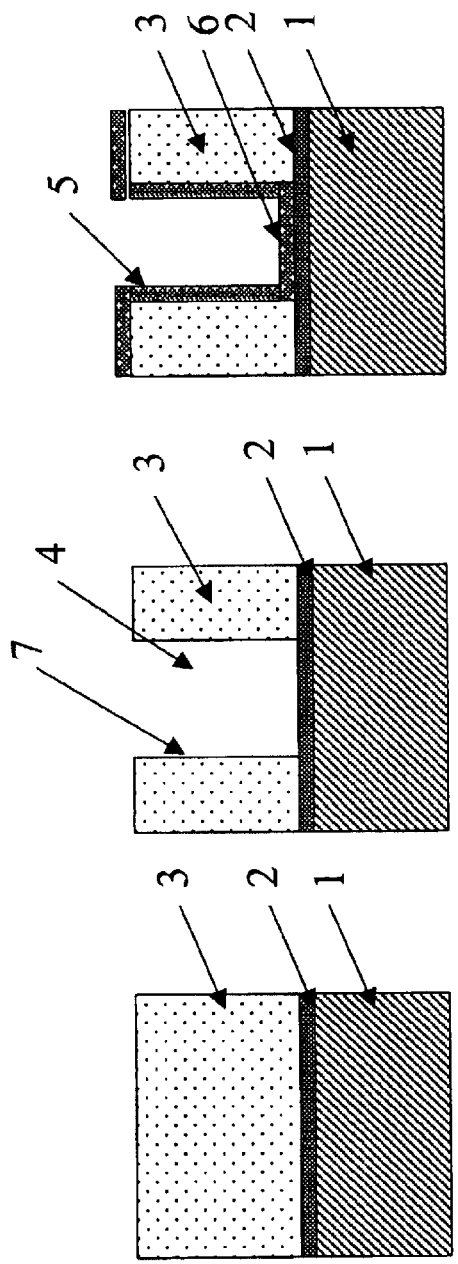
FIG. 1 illustrates the prior method for forming an opening in an insulating layer and depositing a barrier layer on the side walls of the opening according to the prior art.

The following description and examples illustrate preferred embodiments of the present invention in detail. Those of skill in the art will recognize that there are numerous variations and modifications of this invention that are encompassed by its scope. Accordingly, the description of preferred embodiments should not be deemed to limit the scope of the present invention.

In a first aspect of a preferred embodiment, a method is disclosed for forming at least one opening in an insulating layer on a substrate while depositing a barrier layer on the side walls of the opening without essentially depositing the barrier layer on the bottom of the opening, the method comprising the steps of:

subjecting the substrate to a plasma, the plasma being generated in a mixture comprising at least three components including:
a first component for depositing the metal barrier layer on at least the side walls of the opening,
a second component for forming the opening in the insulating layer, and
a third component for removing the barrier layer being formed on the bottom of the opening;
etching the insulating layer with the plasma; and
depositing the barrier layer on the side walls of the opening with the plasma.

As referred to herein, the steps as disclosed in the first aspect of this preferred embodiment are also called plasma etching or plasma etch process, thus including at least the subjecting step, etching step, and depositing step.

The steps of etching and depositing are performed by controlling the plasma in a manner that, while creating an opening in an insulating layer, a barrier layer is formed on the side walls of the opening without essentially forming a barrier layer on the bottom of the opening. The term "essentially" as used in this context means that the barrier layer on the bottom of the opening can be formed but is substantially removed by the plasma.

The term "barrier layer" should be understood as any layer being present on at least a part of the side walls of the opening. If the opening is filled with a material, the barrier layer should be understood to be a layer between the insulating layer and the material filling the opening. The barrier layer should essentially prevent the diffusion of the material filling the opening into the insulating layer.

The term "layer" should be understood to include any layer having a thickness of at least one molecule. Examples of a layer include, but are not limited to, a monolayer, a stack of monolayers, a film with a thickness less than 50 nm, or a film with a thickness greater than 50 nm.

The method as described herein is performed in such a way as to obtain the formation of a barrier layer on at least a part of at least one of the side walls of the opening while etching an opening in the insulating layer. Preferably, the plasma is controlled in such a way that the barrier layer is formed as a permanent, adhesive layer on the side walls of the opening in the insulating material. This means that specific conditions of the plasma, such as the ion energy and bias, the temperature, and the pressure and the composition of the etching gas should be selected. Thus, the barrier layer on the side walls of the opening is essentially not etched during the process. Preferably, the composition of the gaseous mixture and the conditions are chosen so as to obtain removal of the barrier material that builds up at the bottom of the opening. To create an opening in the insulating layer, a plasma is used. Etching using a plasma typically results in anisotropic etching. To obtain plasma etching, the spontaneous etching is preferably negligible while the etch reaction is effectively stimulated by the ion bombardment. In other words, the lateral etch should be negligibly small compared to the vertical etch rate. Furthermore, the plasma should be controlled such that an opening is created in such a manner that while creating an opening, a barrier layer is formed on the side walls of the opening without essentially forming a barrier layer on the bottom of the opening. For the purpose of this invention, plasma etching is understood as plasma-assisted etching, reactive ion etching (RIE), or reactive ion beam etching (RIBE).

The gaseous etching mixture for plasma etching comprises at least three components: a first component for depositing the barrier layer on at least the side walls of the opening, a second component for forming an opening in the insulating layer, and a third component for removing the barrier layer being formed on the bottom of the opening. The first, second, and third component can be different chemical species. The gaseous mixture can also comprise one or two components. If the gaseous component comprises one component, this component is for depositing the barrier layer on at least the side walls of the opening, for forming an opening in the insulating layer, and for removing the barrier layer being formed on the bottom of the opening. This means that the chemical composition and the corresponding physical behavior in a plasma should be pre-selected. If the gaseous mixture comprises at least two components, the first component should be defined as being selected (i) for depositing the barrier layer on at least the side walls of the opening and for forming an opening in the insulating layer, or (ii) for depositing the barrier layer on at least the side walls of the opening and for removing the barrier layer being formed on the bottom of the opening, or (iii) for forming an opening in the insulating layer and for removing the barrier layer being formed on the bottom of the opening. The second component is (i) for depositing the barrier layer on at least the side walls of the opening, or (ii) for forming an opening in the insulating layer, or (iii) for removing the barrier layer being formed on the bottom of the opening.

Various combinations of the first and the second component are possible.

The substrate can be a partly processed or pristine wafer or slice of semi-conductive material, like Si, GaAs, Ge, or an insulating material, e.g. a glass slice or a conductive material. The substrate can comprise a patterned conductive layer. Particularly, when the substrate is a partly processed wafer or slice, at least a part of an active and/or passive device can already be formed and/or at least a part of the structures interconnecting these devices can be formed.

The insulating layer can be an organic-containing insulating layer or an inorganic insulating layer.

The invention as described in the first aspect of this invention is particularly relevant for semiconductor processing.

In a first aspect of a preferred embodiment, a method is disclosed for forming at least one opening in an insulating layer on a substrate while depositing a barrier layer on the side walls of the opening without essentially depositing the barrier layer on the bottom of the opening, the method comprising the steps of:

subjecting the substrate to a plasma, the plasma being generated in a mixture comprising at least three components:
a first component for depositing the barrier layer on at least the side walls of the opening,
a second component for forming an opening in the insulating layer,
a third component for removing the barrier layer being formed on the bottom of the opening;

etching the insulating layer with the plasma; and
depositing the barrier layer on the side walls of the opening with the plasma.

The method can further comprise the step of filling the opening, the side walls of which are covered with a barrier layer, with a conductive material.

The substrate can be a substrate used in semiconducting processing including, but not limited to, e.g., silicon substrates and germanium substrates. The substrate can be a wafer, a structure in the process of IC fabrication, any layer on a substrate in the process of IC fabrication, a semiconducting layer, or a semiconducting layer in the process of IC fabrication.

The term "fabrication" refers to the patterning of structures. More particularly, the substrates can be subjected to damascene processing, dual damascene processing, or front-end processing, where front-end processing means providing contacting on the source, drain, or gate regions.

The term "opening" should be understood to include a via hole, trench, groove, or contact hole made in a substrate used in semiconductor manufacturing. If the opening is a via hole, the opening extends through the insulating layer to an underlying conductive layer or an underlying barrier layer. If the opening is a contact hole, the opening extends through the insulating layer to contact the underlying source, drain, or gate regions.

The term "insulating layer" refers to a layer or a stack of layers made of non-conductive material used to electrically isolate layers made of conductive material from each other. The insulating layer may include silicon oxide, silicon nitride, and silicon oxynitride. The insulating layer can also comprise silicon oxycarbide, with varying concentrations of oxygen, carbon and silicon, as well as hydrogenated silicon oxycarbide. The insulating layer can also be an organic-containing material, including, but not limited to, organic containing materials containing benzyl groups, saturated carbon-carbon bounds, and the like. The insulating layer can be made of porous material.

The barrier layer can be a layer or a stack of layers preventing the diffusion of conductive material (which fills the opening) into the insulating layer. The nature of the barrier layer is determined by the conductive material filling the opening. When the metal is copper, the barrier layer may include, but is not limited to, Ti, TiN, Ta, TaN, $Ta_xSi_yN_z$, $W_xN_y$, $W_xC_yN_z$, SiC, SiOC, hydrogenated SiC, hydrogenated SiOC, and combinations thereof. The thickness of the deposited barrier layer can be lower than 50 nm, lower than 20 nm, and preferably lower than 10 nm. In the most preferred embodiment, the thickness of the barrier layer is between 1 and 5 nm. The barrier layer is a permanent barrier layer; this means that the barrier layer remains essentially on the side walls of the opening after filling the opening. The barrier layer should have a good adhesion to the side walls of the opening.

In the first aspect of a preferred embodiment, the mixture comprises at least three components. The mixture can be a gaseous mixture. The term "components" should be understood to include the chemical molecules present in the reaction chamber and exposed to the plasma. By bringing at least those three components into the plasma, an opening is formed in the insulating layer. Further, a barrier layer is formed on the side walls of the opening.

A first component contains the chemistries accounting for the in-situ deposition of the barrier layer. For a SiC barrier layer, examples of the first component include, but are not limited to, 1-methyl silane (1MS), 2-methyl silane (2MS), 3-methyl silane (3MS), and 4-methyl-silane (4MS). For a $W_xN_y$ barrier layer, the first component may include, but is not limited to, a mixture of $WF_6$ and $N_2$. For a $Si_3N_4$ barrier layer, the first component can be a mixture of $SiH_4$ and $N_2$.

A second component contains the chemistries accounting for the anisotropic etching of the insulating dielectric, thereby creating the opening. Examples of the third component are $N_xO_y$, $C_xF_yH_zO_u$, $N_2/O_2$, $N_2/H_2$, $O_2$, $O_3$, $NH_3$, $CO$, $CO_2$, $CH_4$, and combinations thereof.

A third component contains the chemistries accounting for the anisotropic etching of this barrier layer according to another embodiment of the invention. The second component is able to form ions or radicals in a plasma and is able to react with the barrier layer on the bottom of the opening, such that volatile reaction products are formed. Examples of the second component are fluorine containing chemistries, e.g., $NF_3$, $SF_6$, $F_2$, $ClF_3$, and chlorine containing chemistries, with or with additives such as oxygen.

These etching plasmas can further comprise inert gasses such as helium and argon.

Various combinations of the above-mentioned first component, second component, and third component are possible.

The gaseous mixture can also comprise one or two components. If the gaseous component comprises one component, this component is for depositing the barrier layer on at least the side walls of the opening, for forming an opening in the insulating layer and for removing the barrier layer being formed on the bottom of the opening. If the gaseous mixture comprises at least two components, the first component should be defined as being selected (i) for depositing the barrier layer on at least the side walls of the opening and for forming an opening in the insulating layer, or (ii) for depositing the barrier layer on at least the side walls of the opening and for removing the barrier layer being formed on the bottom of the opening, or (iii) for forming an opening in the insulating layer and for removing the barrier layer being formed on the bottom of the opening. The second component is (i) for depositing the barrier layer on at least the side walls of the opening, or (ii) for forming an opening in the insulating layer or (iii) for removing the barrier layer being formed on the bottom of the opening. Various combinations of the first and the second component are possible.

By subjecting the substrate to a plasma, etching of the insulating layer with the plasma and deposition of the barrier layer on the side walls of the opening with the plasma occurs. The plasma is selected so as to obtain an opening in the insulating layer and so as to obtain a deposition of the barrier layer on the side walls of the opening. This means that the etching gases, the temperature, the pressure, the ion energy and bias of the etching gases are pre-selected. Furthermore, the electron density of the plasma is selected by adjusting the power applied to the plasma, the frequency of the power, and the nature of the walls of the reactor and the inert gases. The gaseous etching mixture can comprise three components. The components are preferably volatile and contain the chemical atoms necessary for the formation of the barrier layer.

In plasma etching, the etched surface is subjected to an ion flux, oriented vertically to the wafer surface. In a plasma, radicals are also generated, but the radicals have a random distribution. This ion flux is present in a plasma that aims to obtain a high degree of anisotropy. The origin of the vertically oriented ion flux is found in the existence of the sheath potential between the bulk of the plasma and the wafer surface, whereas the bulk of the plasma is at a more positive potential than the wafer surface. In the bulk of the plasma, ions move in randomly distributed directions. Whenever they approach the sheath, however, the potential difference induces the ions to collide onto the wafer surface orthogonal to the wafer surface, as implied by the electrical field. The purpose of anisotropic etching is to induce etch reactions to occur in the presence of this ion flux and prevent etching, or cause deposition, on the surfaces that are not subjected to this ion flux. While etching the insulating layer, the insulating material is removed such that an opening is created. The opening is formed by a physical process (ion flux) and a chemical reaction. The ion flux accounts also for the immediate removal of the barrier layer on the bottom of the opening. The ion flux essentially avoids the build-up of a barrier layer on the bottom of the opening. The vertical side walls of the etched openings are preferably not subjected to this ion flux, and hence, etching will not occur.

The etching plasma can be a continuous plasma, meaning that the excitation power is continuously applied to the mixture. The plasma can also be interrupted. Therefore, the power applied to the gaseous mixture is applied for a defined period, e.g., in the range of from 1 ms to 10 ms. The time between the pulses (duty cycle) depends on the specific plasma conditions.

It is also possible to apply a continuous low power and to apply a pulsed plasma.

The process as described herein protects the insulating layer from the etching plasma and, equally important, copper sputtering onto the side walls of the insulating layers becomes less likely because the copper diffusion barrier is already deposited. Furthermore, the process as disclosed in this aspect of the preferred embodiment has the advantage in that the cleaning after barrier etch is facilitated as the insulating material is protected and there is no need for removal of the copper from the side walls of the opening.

The method of a preferred embodiment can, prior to the plasma etching step, further comprise the steps of (i) covering the insulating layer with a bilayer, the bilayer comprising a resist hard mask layer being formed on the insulating layer and a resist layer being formed on the hard mask layer, and (ii) patterning the bilayer. After the plasma etching process as described in the preferred embodiment is conducted, the opening can be cleaned and subsequently filled with a conductive material. The conductive material may include, but is not limited to, a metal such as copper, aluminum, gold, tungsten, and combinations thereof.

Figure 2:
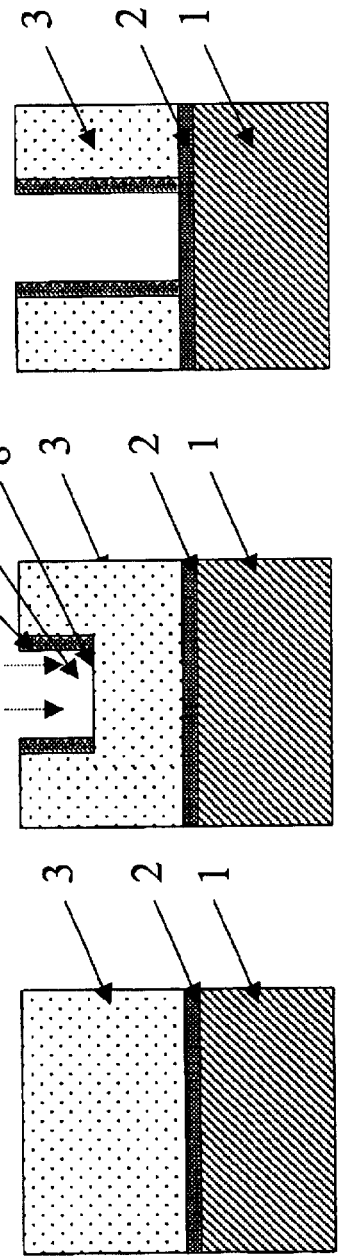
FIG. 2 illustrates a method for forming an opening in an insulating layer while depositing a barrier layer on the side walls of the opening without essentially depositing a barrier layer on the bottom of the opening. The dashed arrows illustrate the anisotropic aspect of the plasma etching

FIG. 2 illustrates a method of a preferred embodiment. There is provided a process for the formation of a opening (4) in an insulating layer (3) while forming a copper barrier layer (5) on the side walls (7) of the opening (4) without essentially forming a barrier layer on the bottom (8) of the opening. The opening is a via hole in an insulating layer. The insulating layer covers an underlying conductive layer (2). The trench extends to the conductive layer. The conductive layer is formed on a substrate (1) subject to back-end IC processing.

According to a preferred embodiment, the copper-barrier layer comprises a silicon carbide layer. For the purpose of this invention, silicon carbide is understood to include a layer composed of at least Si and C, e.g., SiC, or of at least Si, C, and O, i.e., a silicon oxycarbide, e.g., SiOC, or at least Si, C, and H, e.g., an amorphous hydrogenated silicon carbide such as SiC:H. The substrates are introduced into a pressurized chamber of a plasma-etch tool, such as a reactive ion etch (RIE) plasma tool, and then processed. The temperature in the chamber is preferably 600 degrees C. or below, even more preferably below 400 degrees C. This temperature can also be in the range of from 100 to 600 degrees C.

The process is performed using plasma etching with a gaseous mixture comprising at least three components.

A first component contains the chemistries accounting for the in-situ deposition of the barrier layer. For SiC, examples of the first component include, but are not limited to, 1-methyl silane (1MS), 2-methyl silane (2MS), 3-methyl silane (3MS), and 4-methyl-silane (4MS).

A second component contains the chemistries accounting for the anisotropic etching of this barrier layer according to another embodiment of the invention. Examples of the second component include halogen-containing chemistries, e.g., $NF_3$, $SF_6$, $F_2$, $ClF_3$, and chlorine containing chemistries, with or without additives.

A third component contains the chemistries accounting for the anisotropic etching of the insulating dielectric, thereby creating the opening. Examples of the third component include $N_xO_y$, $C_xF_yH_xO_u$, $N_2/O_2$, $N_2/H_2$, $O_2$, $O_3$, and equivalent chemistries.

The amount of each component is preferably at least 0.1% of the total mixture.

Typical ratios of these mixtures include, but are not limited to, 25/50/25.

These etching plasmas can further comprise inert gasses such as helium and argon.

The optimized process conditions, such as temperature, ion energy and bias, pressure, and composition of the plasma depend on the barrier layer to be deposited and on the insulation layer to be simultaneously etched. The type of barrier layer depends on the kind of metal used in the metallization process, e.g., copper, aluminum, and the like.

FIG. 1 illustrates the process as known in the prior art. Compared to the prior art, the method of preferred embodiments minimizes the sputtering of copper onto the side walls of the insulating layers, since the side walls are protected by the deposited barrier layer. The process of preferred embodiments facilitates cleaning after the formation of the opening and there is no need for removal of the copper from the side walls of the opening.

In another embodiment of the present invention, the method as disclosed is used for the formation of a copper-barrier layer while etching a porous insulating material present on a substrate. The substrates that are to be etched can be silicon substrates subject to damascene processing. In a first step, the substrate is subjected to a plasma, the plasma being generated in a gaseous mixture comprising three components: a first component for depositing a SiC barrier layer, a second component for creating an opening in the porous SILK layer, and a third component for removing the SIC barrier layer being formed on the bottom of the opening.

By subjecting the substrate to the plasma, an opening is created in the porous insulating layer, and a SiC barrier layer is formed on the side wall of the opening. Since the insulating layer is made of a porous material, the side walls are rough. By using the method of the preferred embodiments, the opening in the side walls is filled in the first part of the insulating layer, and a barrier layer is formed on the side walls. This results in smooth side walls. In the prior art, when the opening is formed and subsequently the barrier layer is deposited by, e.g., PVD, the barrier layer has the same profile as the rough side wall of the opening. This has a detrimental effect on the final device performance.

According to a preferred embodiment of the invention, the copper-barrier layer comprises a silicon carbide layer. This silicon carbide is understood to be a layer composed of at least Si and C, e.g., SiC, or of at least Si, C, and O, i.e., a silicon oxycarbide, e.g., SiOC, or at least Si, C, and H, such as, e.g., amorphous hydrogenated silicon carbide, SiC:H.

The insulating material is a porous low k dielectric, commercially available as porous SiLK™ (Dow Chemical). The substrate comprises a wafer subjected to back-end IC processing. The porous insulating layer is covered with a hardmask material, e.g., $SiO_2$, SiC, or a combination of $SiO_2$ and SiC, or a spin-on hardmask, on top of which photoresist is spun. The substrates are introduced into a pressurized chamber of a plasma-etch tool, such as a reactive ion etch (RIE) plasma tool, and then processed. The temperature in the chamber is in the range of from 15 to 40 degrees C. RF power settings range from 200 to 2200 W for both electrodes. Operating pressure is typically between 50 and 250 mTorr. The process is performed using plasma etching with a gaseous mixture comprising at least three components. The first component contains the chemistries for the in-situ deposition of the barrier layer. For SiC, 3-methyl-silane (3MS) or 4-methyl-silane (4MS) is used.

The second component contains the chemistries accounting for the anisotropic etching of this barrier layer. Fluorine-containing gases such as $CF_4$, $CHF_3$, $CH_2F_2$, or $CHF_3$ are used. An inorganic hardmask opening is also performed using these gases in combination with an inert gas such as argon in combination with $O_2$ and/or CO.

The third component contains the chemistries for the anisotropic etching of the insulating dielectric whereby the opening is created. Preferred chemistries for this third component are $N_2/O_2$, $N_2/H_2$, and $O_2$, optionally combined with $CH_4$ or $C_2H_4$ for enhanced side wall passivation and hardmask selectivity.

The first step in the processing sequence is the hardmask opening. The second step is etching of the porous insulating material while a SiC layer is deposited on the side walls. To propagate the etching, it is preferred to continuously remove the SiC at the bottom of the etched feature, until the SiC copper diffusion barrier is reached. Finally, this barrier is etched anisotropically, so as not to remove the SiC on the side walls.

In another preferred embodiment, a method is disclosed for forming at least one opening in an insulating layer on a substrate while depositing a barrier layer on the side walls of the opening, the method comprising the steps of:

subjecting the substrate to a plasma, the plasma being generated in a mixture comprising at least two components:

a first component for depositing the barrier layer on at least the side walls of the opening, and a second component for forming an opening in the insulating layer;

etching the insulating layer with the plasma; and depositing the barrier layer on the side walls of the opening with the plasma.

Contrary to the preferred embodiments described previously, in this embodiment it is not necessary to remove the barrier layer from the bottom of the opening. This is particularly relevant when the barrier layer is made of a conductive material.

The various aspects of this preferred embodiment are similar to those of previously described preferred embodiments, with the exception that the gaseous mixture does not comprise a third component.

In a second aspect of a preferred embodiment, a device is disclosed. The device comprises an insulating layer on a substrate, the insulating layer having an opening, the side walls of the opening being covered with a barrier layer, wherein the bottom of the opening is essentially not covered with the barrier layer. The device is obtainable by a method comprising the steps of:

subjecting the substrate to a plasma, the plasma being generated in a gaseous mixture comprising at least three components:
  a first component for depositing the metal barrier layer on at least the side walls of the opening,
  a second component for forming an opening in the insulating layer, and
  a third component for removing the barrier layer being formed on the bottom of the opening;
etching the insulating layer with the plasma; and
depositing the barrier layer on the side walls of the opening with the plasma.

The scope of the method is determined by the disclosure of the first aspect of a preferred embodiment.

In an embodiment of the second aspect of the preferred embodiment, a device is disclosed, the device comprising a porous insulating layer on a substrate, the porous insulating layer having an opening, the side walls of the opening being covered with a barrier layer wherein the bottom of the opening is essentially not covered with the barrier layer. The device is obtainable by a method comprising the steps of:
  subjecting the substrate to a plasma, the plasma being generated in a gaseous mixture comprising at least three components:
    a first component for depositing the metal barrier layer on at least the side walls of the opening,
    a second component for forming an opening in the insulating layer, and
    a third component for removing the barrier layer being formed on the bottom of the opening;
  etching the insulating layer with the plasma; and
  depositing the barrier layer on the side walls of the opening with the plasma.

In the prior art, etching an opening in an insulating material would result in rough openings, since the pores of the insulating material are intersected by the plasma. When the barrier layer is subsequently deposited by a technique known in the prior art, e.g., PVD, the barrier layer has the same profile as the rough side wall of the opening. This has a detrimental effect on the final device performance. By applying the method as described above, the opening in the side walls are filled in the first part of the insulating layer, and a barrier layer will be formed on the side walls. This results in smooth side walls.

The device as disclosed in the second aspect of a preferred embodiment is characterized in that the pores that are intersected by the plasma during the formation of the opening are filled with material forming the barrier layer and that a barrier layer, preferably a thin layer, is formed on the side walls such that the side walls are essentially smooth.

The above description discloses several methods and materials of the present invention. This invention is susceptible to modifications in the methods and materials. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims. The disclosures of all references cited herein are hereby incorporated by reference in their entireties.

What is claimed is:

1. A method for forming at least one opening in an insulating layer on a substrate while depositing a barrier layer on side walls of the opening without essentially depositing the barrier layer on a bottom of the opening, the method comprising the steps of:
  subjecting the substrate to a plasma, the plasma being generated in a gaseous mixture comprising at least three components, the components comprising a first component for depositing the metal barrier layer on at least the side walls of the opening, a second component for forming an opening in the insulating layer, and a third component for removing the barrier layer being formed on the bottom of the opening, wherein the first component is selected from the group consisting of 1-methyl silane, 2-methyl silane, 3-methyl silane, 4-methyl-silane, a mixture of $SiH_4$ and $N_2$, a mixture of $WF_6$ and $N_2$, and combinations thereof, wherein the second component is selected from the group consisting of $N_xO_y$, $C_xF_yH_xO_u$, $N_2/O_2$ mixtures, $N_2/H_2$ mixtures, $O_2$, $O_3$, $NH_3$, CO, $CO_2$, $CH_4$, and combinations thereof, and wherein the third component comprises a chemical compound that forms a halogen ion or a halogen radical in the plasma;
  etching the insulating layer with the plasma; and
  depositing the barrier layer on the side walls of the opening with the plasma.

2. A method as recited in claim 1, wherein the first component is selected from the group consisting of 3-methyl silane and 4-methyl-silane.

3. A method as recited in claim 1 wherein the second component is selected from the group consisting of $N_2/O_2$ mixtures, $N_2/H_2$ mixtures, and $O_2$.

4. A method as recited in claim 1, wherein the third component is selected from the group consisting of $CF_4$, $CHF_3$, $CH_2F_2$, $CHF_3$, and mixtures thereof.

5. A method as recited in claim 1, wherein the third component is selected from the group consisting of $NF_3$, $SF_6$, and mixtures thereof.

6. A method as recited in claim 1, wherein the gaseous mixture further comprises an inert gas selected from the group consisting of Ar, He, $N_2$, and mixtures thereof.

7. A method as recited in claim 1, wherein the plasma is a continuous plasma.

8. A method as recited in claim 1, wherein the plasma is a pulsed plasma.

9. A method as recited in claim 1, wherein the barrier layer is a metal diffusion barrier layer.

10. A method as recited in claim 9, wherein the barrier layer comprises hydrogenated silicon carbide.

11. A method as recited in claim 1, wherein the insulating layer comprises a porous material.

12. A method as recited in claim 1, wherein the insulating layer is an organic containing insulating layer.

13. A method as recited in claim 1, wherein the insulating layer is an inorganic containing insulating layer.

14. A method as recited in claim 1, wherein the opening is a via hole, the via hole extending through the insulating layer to an underlying conductive layer or to an underlying barrier layer.

15. A method as recited in claim 1, further comprising the steps of:
  covering the insulating layer with a bilayer, the bilayer comprising a resist hard mask layer formed on the insulating layer and a resist layer formed on the hard mask layer; and
  patterning the bilayer.

* * * * *